United States Patent
Kuwano (10) Patent No.: US 6,356,131 B1
(45) Date of Patent: Mar. 12, 2002

(54) 90-DEGREE PHASE SHIFTER

(75) Inventor: Akira Kuwano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/691,804

(22) Filed: Oct. 19, 2000

(30) Foreign Application Priority Data

Oct. 19, 1999 (JP) .......................................... 11-297172

(51) Int. Cl.[7] .............................................. H03H 11/16
(52) U.S. Cl. ...................... 327/255; 327/257; 327/258; 327/243; 327/234; 327/236
(58) Field of Search ................. 327/254, 255, 327/256, 257, 258, 231, 233–238, 246, 247, 243, 244

(56) References Cited

U.S. PATENT DOCUMENTS

| | | | | |
|---|---|---|---|---|
| 4,633,315 A | * | 12/1986 | Kasperkovitz | 358/188 |
| 5,179,731 A | * | 1/1993 | Trankle et al. | 327/238 |
| 5,432,480 A | * | 7/1995 | Popescu | 327/236 |
| 6,054,883 A | * | 4/2000 | Ishihara | 327/255 |

FOREIGN PATENT DOCUMENTS

JP 10-75157 3/1998

* cited by examiner

Primary Examiner—Timothy P. Callahan
Assistant Examiner—An T. Luu
(74) Attorney, Agent, or Firm—Scully, Scott, Murphy & Presser (57) ABSTRACT

There is disclosed a 90-degree phase shifter so configured that an input signal is supplied through a variable gain amplifying circuit and a phase adjusting circuit to a low pass filter and also supplied through another variable gain amplifying circuit and another phase adjusting circuit to a high pass filter, so that the low pass filter and the high pass filter generate output signals, respectively, which have a 90-degree phase difference therebetween. An amplitude error and a phase error between the output signals are detected, so that the variable gain amplifying circuits are gain-controlled by the detected amplitude error, and the phase shift amounts of the phase adjusting circuits are controlled by the detected phase error. Thus, the amplitude error and the phase error attributable to the variation in the device characteristics and the parasite component can be removed, so that it is possible to obtain the output signals having the 90-degree phase difference with no amplitude error and no phase error.

15 Claims, 4 Drawing Sheets

90-DEGREE PHASE SHIFTER

BACKGROUND OF THE INVENTION

The present invention relates to a 90-degree phase shifter, and more specifically to a 90-degree phase shifter used for generating a pair of quadrature carriers which are used in detecting an orthogonal signal in a digital broadcasting.

In the prior art, the 90-degree phase shifter is used for example for generating a pair of quadrature carriers (a pair of carrier waves having a 90-degree phase difference therebetween) which are used in detecting an orthogonal signal in a digital broadcasting.

Figure 1:
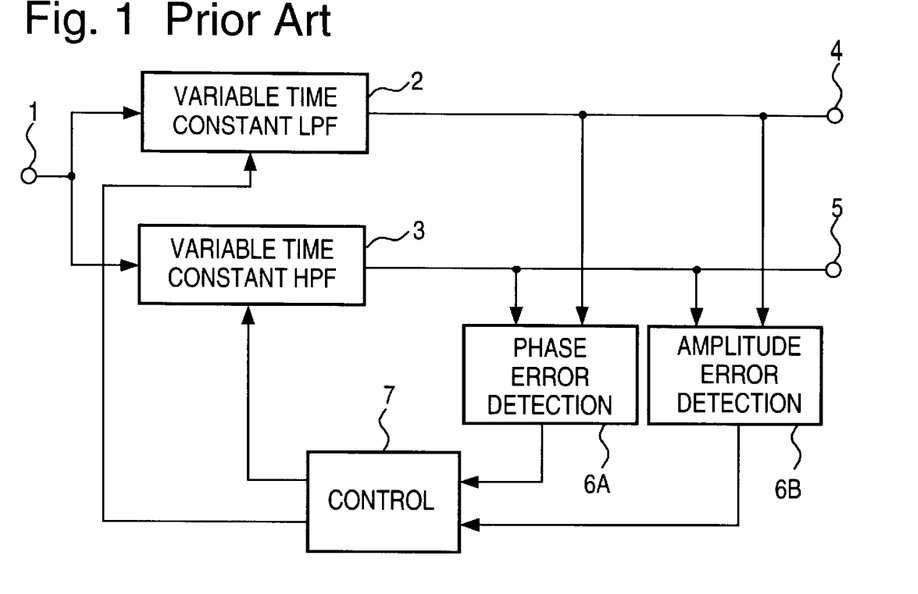
FIG. 1 is a block diagram illustrating the structure of one typical example of the prior art 90-degree phase shifter.

Referring to FIG. 1, there is shown a block diagram illustrating the structure of one typical example of the 90-degree phase shifter disclosed in Japanese Patent Application Pre-examination Publication No. JP-A-10-075157. The shown prior art 90-degree phase shifter includes a variable time constant low pass filter (LPF) 2 and a variable time constant high pass filter (HPF) 3, both of which receive the same input signal 1, and generate output signals 4 and 5 having a 90-degree phase difference therebetween, respectively. A phase error detection means 6A and an amplitude error detection means 6B receive the output signals 4 and 5 of the variable time constant low pass filter 2 and the variable time constant high pass filter 3 to detect a phase error and an amplitude error between the output signals 4 and 5, respectively. A control means 7 receives and synthesizes a phase error signal and an amplitude error signal outputted from the variable time constant low pass filter 2 and the variable time constant high pass filter 3, respectively, and controls respective time constants of the variable time constant low pass filter 2 and the variable time constant high pass filter 3, for the purpose of reducing the phase error and the amplitude error between the output signals 4 and 5 having a 90-degree phase difference therebetween.

On the other hand, a highly precise transmission signal is now required with a recently expedited popularization of the digital broadcasting and the digital communication, and with demands for an increase in the number of channels and in the signal density and for effective utilization of radio signals. However, the prior art cannot optimally remove the amplitude error and the phase error in the transmission signal.

BRIEF SUMMARY OF THE INVENTION

Accordingly, it is an object of the present invention to provide a 90-degree phase shifter which can highly precisely remove the amplitude error and the phase error in the transmission signal.

The above and other objects of the present invention are achieved in accordance with the present invention by a 90-degree phase shifter comprising:

an input terminal, a first output terminal, and a second output terminal;

a first variable gain amplifying means, a first phase adjusting means and a low pass filter means, which are cascaded between the input terminal and the first output terminal;

a second variable gain amplifying means, a second phase adjusting means and a high pass filter means, which are cascaded between the input terminal and the second output terminal;

a phase error detection means receiving a first output signal on the first output terminal and a second output signal on the second output terminal for detecting a phase error between the first output signal and the second output signal to supply a first phase adjusting signal and a second phase adjusting signal to the first phase adjusting means and the second phase adjusting means, respectively; and an amplitude error detection means receiving the first output signal and the second output signal for detecting an amplitude error between the first output signal and the second output signal to supply a first gain control signal and a second gain control signal to the first variable gain amplifying means and the second variable gain amplifying means, respectively, whereby the phase error and the amplitude error between the first output signal and the second output signal are removed independently of each other.

Here, the problem of the prior art 90-degree phase shifter is examined in detail. The prior art 90-degree phase shifter has a problem that a DC bias dependency is large and variation of the time constant is large in a convergent condition. A first ground of causing this problem is considered that in the prior art 90-degree phase shifter, two error components, namely, an amplitude error $\Delta V$ and a phase error $\Delta \phi$ are synthesized to generate a pair of control signals supplied to the pair of variable time constant filters, respectively. In other words, one variable time constant filter is supplied with only one control signal for the purpose of attempting to minimize both the amplitude error and the phase error. However, it is in some cases that it is not possible to obtain an optimum control signal capable of removing both the amplitude error $\Delta V$ and the phase error $\Delta \phi$. In addition, it is in some cases that there is no convergence value which minimizes both the amplitude error and the phase error.

Secondly, since the variable time constant filter includes an active resistive or capacitive element whose resistance or capacitance can be controlled by an applied voltage, there is no way other than to use an element having such a large degree of bias dependency that for example the resistance value greatly varies with only a periodical change of the DC voltage of the input signal.

The above mentioned problems can be overcome by the present invention, since the phase error and the amplitude error between the first output signal and the second output signal can be removed independently of each other.

In a first embodiment of the 90-degree phase shifter in accordance with the present invention, the first variable gain amplifying means, the first phase adjusting means and the low pass filter means are cascaded in the named order between the input terminal and the first output terminal, so that an input of the first variable gain amplifying means is connected to the input terminal and an output of the low pass filter means is connected to the first output terminal, and the second variable gain amplifying means, the second phase adjusting means and the high pass filter means are cascaded in the named order between the input terminal and the second output terminal, so that an input of the second variable gain amplifying means is connected to the input terminal and an output of the high pass filter means is connected to the second output terminal.

In a second embodiment of the 90-degree phase shifter in accordance with the present invention, the first variable gain amplifying means, the low pass filter means and the first phase adjusting means are cascaded in the named order between the input terminal and the first output terminal, so that an input of the first variable gain amplifying means is connected to the input terminal and an output of the first phase adjusting means is connected to the first output terminal, and the second variable gain amplifying means, the high pass filter means and the second phase adjusting means are cascaded in the named order between the input terminal and the second output terminal, so that an input of the second variable gain amplifying means is connected to the input terminal and an output of the second phase adjusting means is connected to the second output terminal.

In a third embodiment of the 90-degree phase shifter in accordance with the present invention, the low pass filter means, the first variable gain amplifying means and the first phase adjusting means are cascaded in the named order between the input terminal and the first output terminal, so that an input of the low pass filter means is connected to the input terminal and an output of the first phase adjusting means is connected to the first output terminal, and the high pass filter means, the second variable gain amplifying means and the second phase adjusting means are cascaded in the named order between the input terminal and the second output terminal, so that an input of the high pass filter means is connected to the input terminal and an output of the second phase adjusting means is connected to the second output terminal.

In a fourth embodiment of the 90-degree phase shifter in accordance with the present invention, the first phase adjusting means, the first variable gain amplifying means and the low pass filter means are cascaded in the named order between the input terminal and the first output terminal, so that an input of the first phase adjusting means is connected to the input terminal and an output of the low pass filter means is connected to the first output terminal, and the second phase adjusting means, the second variable gain amplifying means and the high pass filter means are cascaded in the named order between the input terminal and the second output terminal, so that an input of the second phase adjusting means is connected to the input terminal and an output of the high pass filter means is connected to the second output terminal.

In a fifth embodiment of the 90-degree phase shifter in accordance with the present invention, the first phase adjusting means, the low pass filter means and the first variable gain amplifying means are cascaded in the named order between the input terminal and the first output terminal, so that an input of the first phase adjusting means is connected to the input terminal and an output of the first variable gain amplifying means is connected to the first output terminal, and the second phase adjusting means, the high pass filter means and the second variable gain amplifying means are cascaded in the named order between the input terminal and the second output terminal, so that an input of the second phase adjusting means is connected to the input terminal and an output of the second variable gain amplifying means is connected to the second output terminal.

In a sixth embodiment of the 90-degree phase shifter in accordance with the present invention, the low pass filter means, the first phase adjusting means and the first variable gain amplifying means are cascaded in the named order between the input terminal and the first output terminal, so that an input of the low pass filter means is connected to the input terminal and an output of the first variable gain amplifying means is connected to the first output terminal, and the high pass filter means, the second phase adjusting means and the second variable gain amplifying means are cascaded in the named order between the input terminal and the second output terminal, so that an input of the high pass filter means is connected to the input terminal and an output of the second variable gain amplifying means is connected to the second output terminal.

Specifically, in the 90-degree phase shifter in accordance with the present invention, the first phase adjusting means can include a first constant current source means connected in series therewith, the first controllable constant current source means being controlled by the first phase adjusting signal, and the second phase adjusting means can include a second controllable constant current source means connected in series therewith, the second controllable constant current source means being controlled by the second phase adjusting signal.

More specifically, the first phase adjusting means can include a first transistor and a first controllable constant current source means connected in series between a high voltage terminal and a ground, a control terminal of the first transistor constituting an input of the first phase adjusting means, and a connection node between the first transistor and the first controllable constant current source means constituting an output of the first phase adjusting means, the first controllable constant current source means being controlled by the first phase adjusting signal. The second phase adjusting means can include a second transistor and a second controllable constant current source means connected in series between a high voltage terminal and a ground, a control terminal of the second transistor constituting an input of the second phase adjusting means, and a connection node between the second transistor and the second controllable constant current source means constituting an output of the second phase adjusting means, the second controllable constant current source means being controlled by the second phase adjusting signal.

The above and other objects, features and advantages of the present invention will be apparent from the following description of preferred embodiments of the invention with reference to the accompanying drawings.

DETAILED DESCRIPTION OF THE INVENTION

First Embodiment

Figure 2:
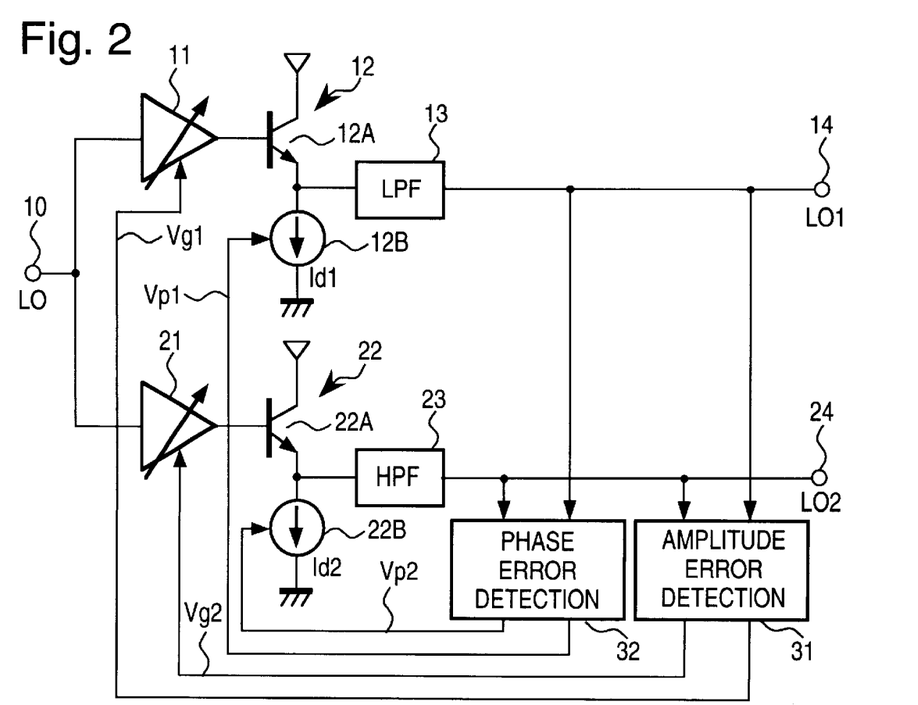
FIG. 2 is a circuit diagram of a first embodiment of the 90-degree phase shifter in accordance with the present invention.

Referring to FIG. 2, there is shown a circuit diagram of a first embodiment of the 90-degree phase shifter in accordance with the present invention.

The shown 90-degree phase shifter is based on a RC phase shifting, and includes a low pass filter (LPF) 13 and a high pass filter (HPF) 23 which have the same cutoff frequency fc determined by the time constant of a resistance and a capacitance. An output of the low pass filter 13 is connected to an output terminal 14, and an output of the high pass filter 23 is connected to another output terminal 24.

The shown 90-degree phase shifter also includes an amplitude error detection circuit 31 receiving an output signal LO1 of the low pass filter 12 and an output signal LO2 of the high pass filter 23 for detecting an amplitude error between the output signal LO1 and the output signal LO2, and a phase error detection circuit 32 receiving the output signal LO1 and the output signal LO2 for detecting a phase deviation from 90 degrees, of a phase difference between the output signal LO1 and the output signal LO2.

The shown 90-degree phase shifter includes a pair of variable gain amplifying circuits 11 and 21 each of which has an input connected to an input terminal 10 to receive a local signal LO supplied to the 90-degree phase shifter. The variable gain amplifying circuit 11 is gain-controlled by a negative feedback control signal (first gain control signal) Vg1 from the amplitude error detection circuit 31, and the variable gain amplifying circuit 21 is gain-controlled by a negative feedback control signal (second gain control signal) Vg2 from the amplitude error detection circuit 31.

Outputs of the variable gain amplifying circuits 11 and 21 are respectively connected to a pair of phase adjusting circuits 12 and 22 having an AC voltage gain of 0 dB. A phase shift amount of the phase adjusting circuit 12 is controlled by a negative feedback control signal (first phase adjusting signal) Vp1 from the phase error detection circuit 32, and a phase shift amount of the phase adjusting circuit 22 is controlled by a negative feedback control signal (second phase adjusting signal) Vp2 from the phase error detection circuit 32. Outputs of the phase adjusting circuits 12 and 22 are connected to the low pass filter 13 and the high pass filter 23, respectively.

Specifically, the phase adjusting circuits 12 and 22 are a phase adjusting emitter follower circuit. The phase adjusting circuit 12 includes an NPN bipolar transistor 12A having a collector connected to a high voltage power supply terminal, a base connected to the output of the variable gain amplifying circuit 11 (as an input of the phase adjusting circuit 12) and an emitter connected through a controllable constant current source 12B to ground. A connection node between the transistor 12A and the controllable constant current source 12B is connected to an input of the low pass filter 13 (as an output of the phase adjusting circuit 12). The controllable constant current source 12B is controlled by the negative feedback control signal Vp1 from the phase error detection circuit 32 so that the current value Id1 allowed to flow through the controllable constant current source 12B is adjusted.

The phase adjusting circuit 22 includes an NPN bipolar transistor 22A having a collector connected to the high voltage power supply terminal, a base connected to the output of the variable gain amplifying circuit 21 (as an input of the phase adjusting circuit 22) and an emitter connected through a controllable constant current source 22B to the ground. A connection node between the transistor 22A and the controllable constant current source 22B is connected to an input of the high pass filter 23 (as an output of the phase adjusting circuit 22). The controllable constant current source 22B is controlled by the negative feedback control signal Vp2 from the phase error detection circuit 32 so that the current value Id2 allowed to flow through the controllable constant current source 22B is adjusted.

Now, an operation of the shown 90-degree phase shifter will be described. The shown 90-degree phase shifter is so designed that: When the negative feedback control signals are Vg1=Vg2 and Vp1=Vp2, the variable gain amplifying circuits 11 and 21 are in an equivalent condition having the same voltage gain, and the phase adjusting circuits 12 and 22 (having a variable delay amount, namely, a variable phase shift amount) are in an equivalent condition having the same phase shift amount. Under this condition, if the local signal LO is applied to the low pass filter 13 and the high pass filter 23, the low pass filter 13 and the high pass filter 23 generate the quadrature output signals LO1 and LO2 (which have a 90-degree phase difference therebetween). At this time, assuming that the cutoff frequencies of the low pass filter 13 and the high pass filter 23 are expressed as fc1 and fc2, respectively, the cutoff frequencies of the low pass filter 13 and the high pass filter 23 becomes equal (fc1=fc2 (=fc)), and the frequency fLO of the output signals LO1 and LO2 becomes fc (fLO=Fc).

However, if the cutoff frequency fc of the low pass filter 13 and the high pass filter 23 does not become equal to the frequency fLO of the output signals (fc≈fLO) because of variation in the device characteristics, an amplitude error occurs between the two output signals LO1 and LO2. In addition, if the cutoff frequencies fc1 and fc2 of the low pass filter 13 and the high pass filter 23 does not become equal (fc1≈fc2) because of a parasite component, not only an amplitude error but also a phase error occurs between the two output signals LO1 and LO2.

In the shown 90-degree phase shifter, the amplitude error detection circuit 31 detects the amplitude error $\Delta V$ between the voltage VLO1 of the output signal LO1 and the voltage VLO2 of the output signal LO2 ($\Delta V$=VLO1−VLO2), and generates the negative feedback control signals Vg1 and Vg2 which have the relation of $\Delta V$=−n×(Vg1−Vg2) where "n" is a positive integer. The negative feedback control signals Vg1 and Vg2 fed back to the variable gain amplifying circuits 11 and 21, respectively, so that respective voltage gains Gv1 and Gv2 of the variable gain amplifying circuits 11 and 21 are adjusted to remove the amplitude error.

The phase error detection circuit 32 detects a difference $\Delta\phi$ between 90 degrees and a phase difference between the phase $\phi$LO1 of the output signal LO1 and the phase $\phi$LO2 of the output signal LO2 ($\Delta\phi$=90 degrees −($\phi$LO1−$\phi$LO2)) and generates the negative feedback control signals Vp1 and Vp2 which have the relation of $\Delta\phi$=−m×(Vp1−Vp2) where "m" is a positive integer. The negative feedback control signals Vp1 and Vp2 are fed back to the controllable constant current sources 12B and 22B, respectively, to adjust the respective phase shift amounts of the phase adjusting circuits 12 and 22 so as to remove the phase error. At this time, the respective phase shift amounts $\phi$1 and $\phi$2 of the phase adjusting circuits 12 and 22 and the respective currents Id1 and Id2 of the controllable constant current sources 12B and 22B are in a relation that $\phi$1 is in proportion to 1/Id1 and $\phi$2 is in proportion to 1/Id2.

Thus, the shown 90-degree phase shifter can removes the amplitude error and the phase error attributable to the variation in the device characteristics. Ordinarily, when the same signal is applied to the low pass filter 13 and the high pass filter 23, if it is assumed that there is no parasite component, the cutoff frequency fc of the filters is deviated because of the variation in the device characteristics, with the result that the phase difference between the output signals LO1 and LO2 is maintained at 90 degrees but an amplitude error $\Delta V$ occurs. This amplitude error $\Delta V$ is detected by the amplitude error detection circuit 31, and is negatively fed back to the variable gain amplifying circuits 11 and 21 to remove the amplitude error.

Furthermore, a phase error $\Delta\phi$ occurs because of a parasite component and because the variable gain amplifying circuits 11 and 21 have different AC voltage gains. The phase error $\Delta\phi$ is detected by the phase error detection circuit 32, and is negatively fed back to the controllable constant current sources 12B and 22B of the phase adjusting circuits 12 and 22 having the AC voltage gain of 0 dB, to adjust the respective phase shift amounts of the phase adjusting circuits 12 and 22 so as to remove the phase error.

Thus, it is possible to completely remove both the amplitude error and the phase error between the two output signals LO1 and LO2.

Second Embodiment

Figure 3:
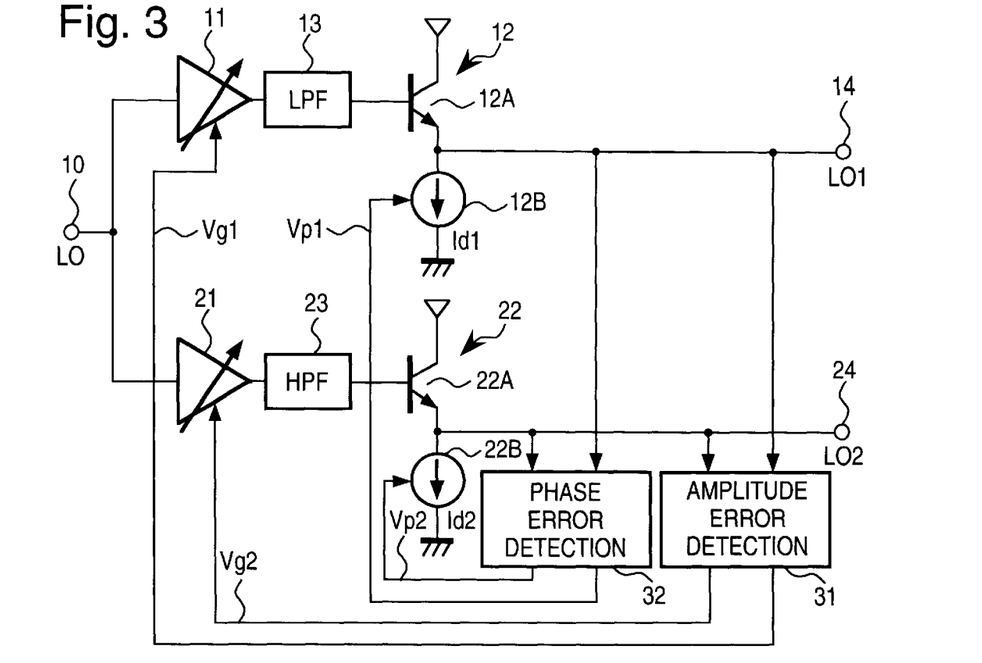
FIGS. 3 to 7 are circuit diagrams of second to sixth embodiments of the 90-degree phase shifter in accordance with the present invention.

In the above mentioned first embodiment as shown in FIG. 2, the phase adjusting circuits 12 and 22 can be located after the low pass filter 13 and the high pass filter 23, respectively, as shown in FIG. 3 showing a circuit diagram of a second embodiment of the 90-degree phase shifter in accordance with the present invention. In this second embodiment, an advantage similar to that obtained in the first embodiment can be obtained.

Third Embodiment

Figure 4:
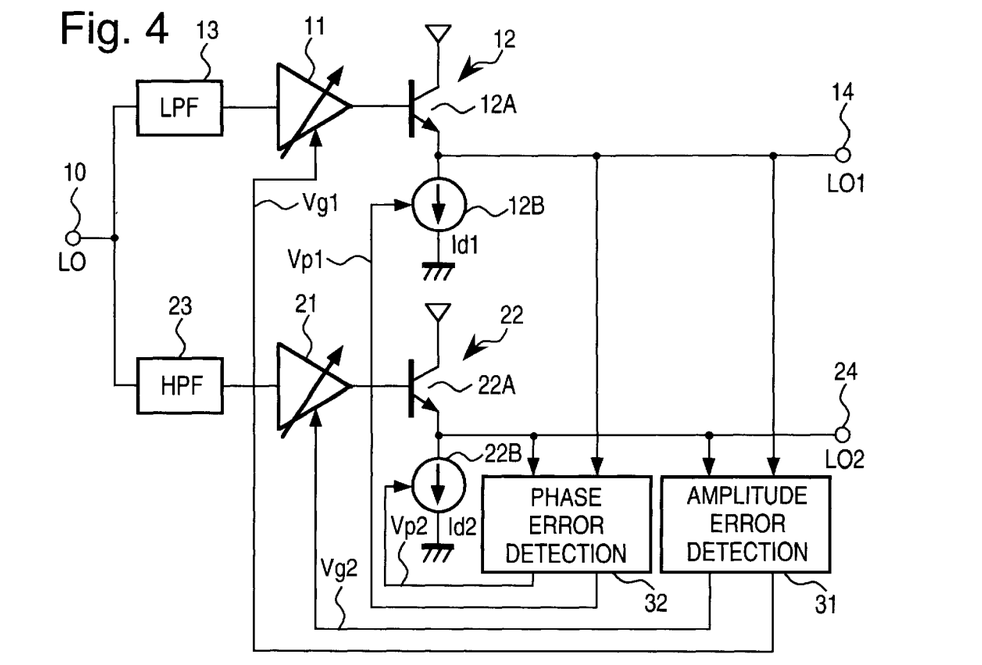

In the above mentioned first embodiment as shown in FIG. 2, the variable gain amplifying circuits 11 and 21 and the phase adjusting circuits 12 and 22 can be located after the low pass filter 13 and the high pass filter 23, respectively, as shown in FIG. 4 showing a circuit diagram of a third embodiment of the 90-degree phase shifter in accordance with the present invention. In this third embodiment, an advantage similar to that obtained in the first embodiment can be obtained.

Fourth Embodiment

Figure 5:
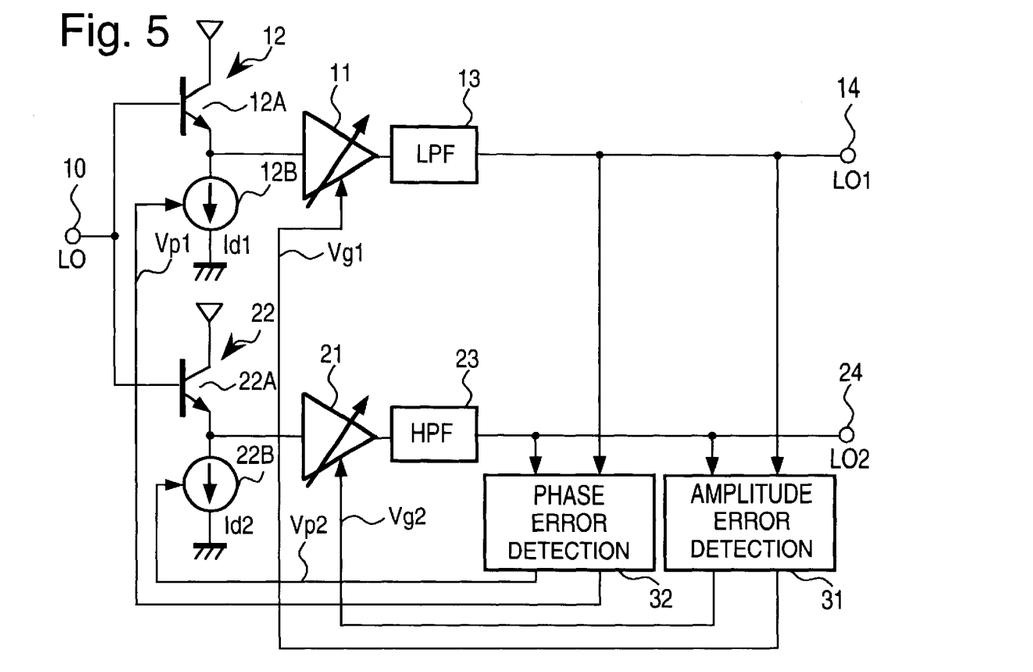

In the above mentioned first embodiment as shown in FIG. 2, the variable gain amplifying circuits 11 and 21 and the phase adjusting circuits 12 and 22 can be mutually exchanged in position, respectively, as shown in FIG. 5 showing a circuit diagram of a fourth embodiment of the 90-degree phase shifter in accordance with the present invention. In this fourth embodiment, an advantage similar to that obtained in the first embodiment can be obtained.

Fifth Embodiment

Figure 6:
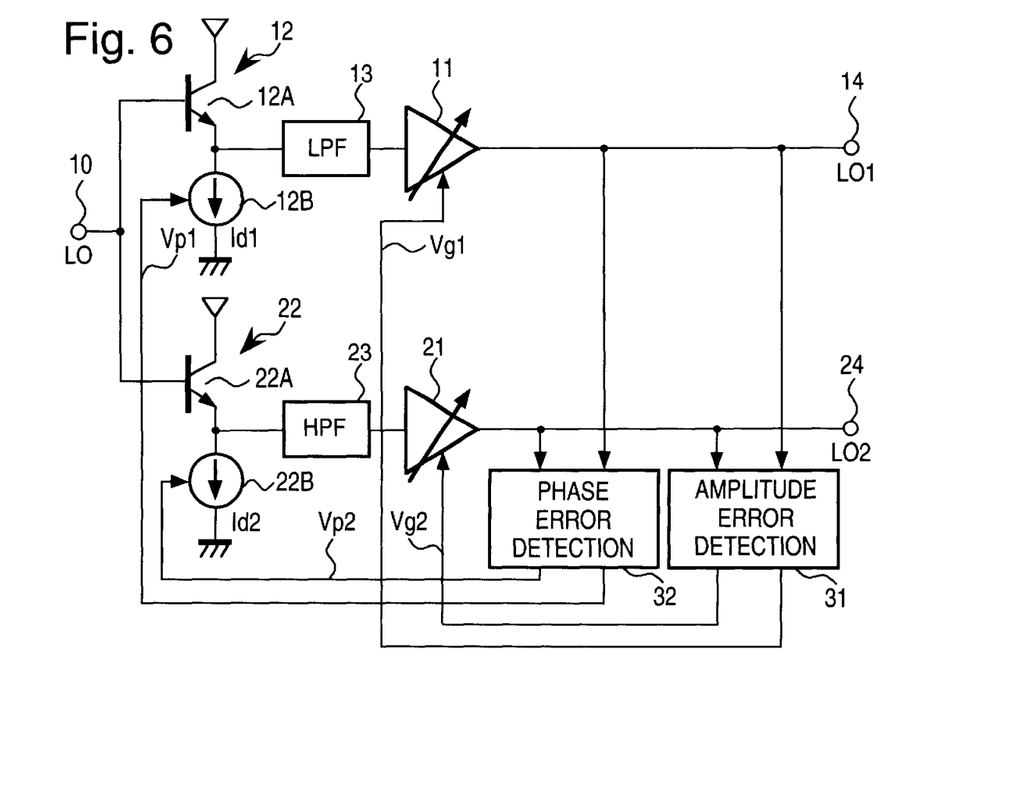
Figure 7:
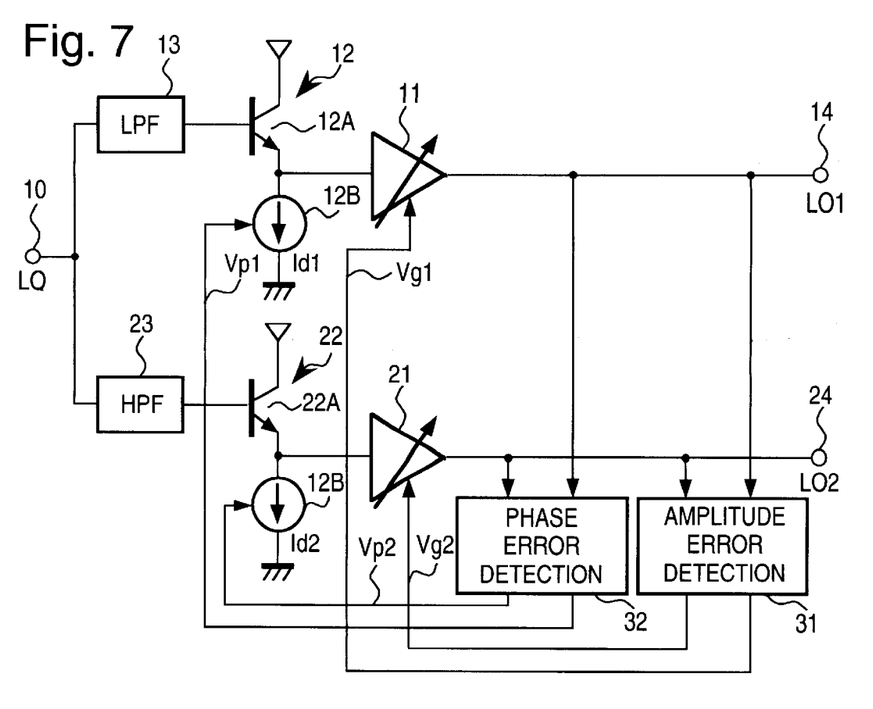

In the above mentioned second embodiment as shown in FIG. 3, the variable gain amplifying circuits 11 and 21 and the phase adjusting circuits 12 and 22 can be mutually exchanged in position, respectively, as shown in FIG. 6 showing a circuit diagram of a fifth embodiment of the 90-degree phase shifter in accordance with the present invention. In this fifth embodiment, an advantage similar to that obtained in the first embodiment can be obtained.

Sixth Embodiment

In the above mentioned third embodiment as shown in FIG. 4, the variable gain amplifying circuits 11 and 21 and the phase adjusting circuits 12 and 22 can be mutually exchanged in position, respectively, as shown in FIG. 6 showing a circuit diagram of a sixth embodiment of the 90-degree phase shifter in accordance with the present invention. In this sixth embodiment, an advantage similar to that obtained in the first embodiment can be obtained.

As seen from the above, the 90-degree phase shifter in accordance with the present invention is so configured that the input signal is branched to two signals which are respectively amplified by the two variable gain amplifying means, phase-adjusted by the two phase adjusting means, and filtered or pass-band-limited by the low pass filter means and the high pass filter means, so that the two output signals having a 90-degree phase difference therebetween are generated. An amplitude error and a phase error between the two output signals are detected, so that the variable gain amplifying means are gain-controlled on the basis of the detected amplitude error, and the phase shift amounts of the phase adjusting means are controlled on the basis of the detected phase error. Thus, the amplitude error and the phase error attributable to the variation in the device characteristics and the parasite component can be removed, so that it is possible to obtain the two output signals having the 90-degree phase difference with no amplitude error and no phase error.

The invention has thus been shown and described with reference to the specific embodiments. However, it should be noted that the present invention is in no way limited to the details of the illustrated structures but changes and modifications may be made within the scope of the appended claims.

What is claimed is:

1. A 90-degree phase shifter comprising:

an input terminal, a first output terminal, and a second output terminal;

a first variable gain amplifying means, a first phase adjusting means and a low pass filter means, which are cascaded between said input terminal and said first output terminal;

a second variable gain amplifying means, a second phase adjusting means and a high pass filter means, which are cascaded between said input terminal and said second output terminal;

a phase error detection means receiving a first output signal on said first output terminal and a second output signal on said second output terminal for detecting a phase error between said first output signal and said second output signal to supply a first phase adjusting signal and a second phase adjusting signal to said first phase adjusting means and said second phase adjusting means, respectively; and an amplitude error detection means receiving said first output signal and said second output signal for detecting an amplitude error between said first output signal and said second output signal to supply a first gain control signal and a second gain control signal to said first variable gain amplifying means and said second variable gain amplifying means, respectively, whereby said phase error and said amplitude error between said first output signal and said second output signal are removed independently of each other.

2. A 90-degree phase shifter claimed in claim 1 wherein said first variable gain amplifying means, said first phase adjusting means and said low pass filter means are cascaded in the named order between said input terminal and said first output terminal, so that an input of said first variable gain amplifying means is connected to said input terminal and an output of said low pass filter means is connected to said first output terminal, and wherein said second variable gain amplifying means, said second phase adjusting means and said high pass filter means are cascaded in the named order between said input terminal and said second output terminal, so that an input of said second variable gain amplifying means is connected to said input terminal and an output of said high pass filter means is connected to said second output terminal.

3. A 90-degree phase shifter claimed in claim 1 wherein said first variable gain amplifying means, said low pass filter means and said first phase adjusting means are cascaded in the named order between said input terminal and said first output terminal, so that an input of said first variable gain amplifying means is connected to said input terminal and an output of said first phase adjusting means is connected to said first output terminal, and wherein said second variable gain amplifying means, said high pass filter means and said second phase adjusting means are cascaded in the named order between said input terminal and said second output terminal, so that an input of said second variable gain amplifying means is connected to said input terminal and an output of said second phase adjusting means is connected to said second output terminal.

4. A 90-degree phase shifter claimed in claim 1 wherein said low pass filter means, said first variable gain amplifying means and said first phase adjusting means are cascaded in the named order between said input terminal and said first output terminal, so that an input of said low pass filter means is connected to said input terminal and an output of said first phase adjusting means is connected to said first output terminal, and wherein said high pass filter means, said second variable gain amplifying means and said second phase adjusting means are cascaded in the named order between said input terminal and said second output terminal, so that an input of said high pass filter means is connected to said input terminal and an output of said second phase adjusting means is connected to said second output terminal.

5. A 90-degree phase shifter claimed in claim 1 wherein said first phase adjusting means, said first variable gain amplifying means and said low pass filter means are cascaded in the named order between said input terminal and said first output terminal, so that an input of said first phase adjusting means is connected to said input terminal and an output of said low pass filter means is connected to said first output terminal, and wherein said second phase adjusting means, said second variable gain amplifying means and said high pass filter means are cascaded in the named order between said input terminal and said second output terminal, so that an input of said second phase adjusting means is connected to said input terminal and an output of said high pass filter means is connected to said second output terminal.

6. A 90-degree phase shifter claimed in claim 1 wherein said first phase adjusting means, said low pass filter means and said first variable gain amplifying means are cascaded in the named order between said input terminal and said first output terminal, so that an input of said first phase adjusting means is connected to said input terminal and an output of said first variable gain amplifying means is connected to said first output terminal, and wherein said second phase adjusting means, said high pass filter means and said second variable gain amplifying means are cascaded in the named order between said input terminal and said second output terminal, so that an input of said second phase adjusting means is connected to said input terminal and an output of said second variable gain amplifying means is connected to said second output terminal.

7. A 90-degree phase shifter claimed in claim 1 wherein said low pass filter means, said first phase adjusting means and said first variable gain amplifying means are cascaded in the named order between said input terminal and said first output terminal, so that an input of said low pass filter means is connected to said input terminal and an output of said first variable gain amplifying means is connected to said first output terminal, and wherein said high pass filter means, said second phase adjusting means and said second variable gain amplifying means are cascaded in the named order between said input terminal and said second output terminal, so that an input of said high pass filter means is connected to said input terminal and an output of said second variable gain amplifying means is connected to said second output terminal.

8. A 90-degree phase shifter claimed in claim 1 wherein said first phase adjusting means includes a first constant current source means connected in series therewith, said first controllable constant current source means being controlled by said first phase adjusting signal, and said second phase adjusting means includes a second controllable constant current source means connected in series therewith, said second controllable constant current source means being controlled by said second phase adjusting signal.

9. A 90-degree phase shifter claimed in claim 1 wherein said first phase adjusting means includes a first transistor and a first controllable constant current source means connected in series between a high voltage terminal and a ground, a control terminal of said first transistor constituting an input of said first phase adjusting means, and a connection node between said first transistor and said first controllable constant current source means constituting an output of said first phase adjusting means, said first controllable constant current source means being controlled by said first phase adjusting signal, and wherein said second phase adjusting means includes a second transistor and a second controllable constant current source means connected in series between a high voltage terminal and a ground, a control terminal of said second transistor constituting an input of said second phase adjusting means, and a connection node between said second transistor and said second controllable constant current source means constituting an output of said second phase adjusting means, said second controllable constant current source means being controlled by said second phase adjusting signal.

10. A 90-degree phase shifter claimed in claim 9 wherein said first variable gain amplifying means, said first phase adjusting means and said low pass filter means are cascaded in the named order between said input terminal and said first output terminal, so that an input of said first variable gain amplifying means is connected to said input terminal and an output of said low pass filter means is connected to said first output terminal, and wherein said second variable gain amplifying means, said second phase adjusting means and said high pass filter means are cascaded in the named order between said input terminal and said second output terminal, so that an input of said second variable gain amplifying means is connected to said input terminal and an output of said high pass filter means is connected to said second output terminal.

11. A 90-degree phase shifter claimed in claim 9 wherein said first variable gain amplifying means, said low pass filter means and said first phase adjusting means are cascaded in the named order between said input terminal and said first output terminal, so that an input of said first variable gain amplifying means is connected to said input terminal and an output of said first phase adjusting means is connected to said first output terminal, and wherein said second variable gain amplifying means, said high pass filter means and said second phase adjusting means are cascaded in the named order between said input terminal and said second output terminal, so that an input of said second variable gain amplifying means is connected to said input terminal and an output of said second phase adjusting means is connected to said second output terminal.

12. A 90-degree phase shifter claimed in claim 9 wherein said low pass filter means, said first variable gain amplifying means and said first phase adjusting means are cascaded in the named order between said input terminal and said first output terminal, so that an input of said low pass filter means is connected to said input terminal and an output of said first phase adjusting means is connected to said first output terminal, and wherein said high pass filter means, said second variable gain amplifying means and said second phase adjusting means are cascaded in the named order between said input terminal and said second output terminal, so that an input of said high pass filter means is connected to said input terminal and an output of said second phase adjusting means is connected to said second output terminal.

13. A 90-degree phase shifter claimed in claim 9 wherein said first phase adjusting means, said first variable gain amplifying means and said low pass filter means are cascaded in the named order between said input terminal and said first output terminal, so that an input of said first phase adjusting means is connected to said input terminal and an output of said low pass filter means is connected to said first output terminal, and wherein said second phase adjusting means, said second variable gain amplifying means and said high pass filter means are cascaded in the named order between said input terminal and said second output terminal, so that an input of said second phase adjusting means is connected to said input terminal and an output of said high pass filter means is connected to said second output terminal.

14. A 90-degree phase shifter claimed in claim 9 wherein said first phase adjusting means, said low pass filter means and said first variable gain amplifying means are cascaded in the named order between said input terminal and said first output terminal, so that an input of said first phase adjusting means is connected to said input terminal and an output of said first variable gain amplifying means is connected to said first output terminal, and wherein said second phase adjusting means, said high pass filter means and said second variable gain amplifying means are cascaded in the named order between said input terminal and said second output terminal, so that an input of said second phase adjusting means is connected to said input terminal and an output of said second variable gain amplifying means is connected to said second output terminal.

15. A 90-degree phase shifter claimed in claim 9 wherein said low pass filter means, said first phase adjusting means and said first variable gain amplifying means are cascaded in the named order between said input terminal and said first output terminal, so that an input of said low pass filter means is connected to said input terminal and an output of said first variable gain amplifying means is connected to said first output terminal, and wherein said high pass filter means, said second phase adjusting means and said second variable gain amplifying means are cascaded in the named order between said input terminal and said second output terminal, so that an input of said high pass filter means is connected to said input terminal and an output of said second variable gain amplifying means is connected to said second output terminal.

\* \* \* \* \*